(12) United States Patent
Arao et al.

(10) Patent No.: US 7,195,858 B2
(45) Date of Patent: Mar. 27, 2007

(54) NEGATIVE TYPE PHOTOSENSITIVE RESIN COMPOSITION CONTAINING A PHENOL-BIPHENYLENE RESIN

(75) Inventors: Kei Arao, Niigata (JP); Makoto Nomura, Niigata (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/768,941

(22) Filed: Jan. 30, 2004

(65) Prior Publication Data

US 2004/0219451 A1 Nov. 4, 2004

(30) Foreign Application Priority Data

Feb. 6, 2003 (JP) .............................. 2003/029930

(51) Int. Cl.
*G03F 7/038* (2006.01)

(52) U.S. Cl. .................................... 430/280.1; 430/325

(58) Field of Classification Search ............. 430/280.1, 430/325
See application file for complete search history.

(56) References Cited

U.S. PATENT DOCUMENTS

| | | | |
|---|---|---|---|
| 4,231,951 A * | 11/1980 | Smith et al. ................... 556/80 |
| 5,262,280 A | 11/1993 | Knudsen et al. | |
| 5,300,380 A | 4/1994 | Roth et al. | |
| 5,312,715 A | 5/1994 | Daniels et al. | |
| 5,334,671 A | 8/1994 | Yezrielev et al. | |
| 5,366,846 A | 11/1994 | Knudsen et al. | |
| 5,514,728 A | 5/1996 | Lamanna et al. | |
| 5,858,618 A | 1/1999 | Tzou | |
| 5,877,229 A | 3/1999 | Janke et al. | |
| 6,730,402 B2 | 5/2004 | Kiuchi et al. | |
| 2003/0152776 A1 | 8/2003 | Kiuchi et al. | |
| 2004/0224253 A1 | 11/2004 | Arao et al. | |

FOREIGN PATENT DOCUMENTS

| | | | |
|---|---|---|---|
| EP | 1142923 A1 * | 10/2001 | |
| EP | 1260551 A1 * | 11/2002 | |
| JP | 55129341 | 10/1980 | |
| JP | 56-150741 | 11/1981 | |
| JP | 60026943 | 2/1985 | |
| JP | 1993-273753 A | 10/1993 | |
| JP | 1994-102662 A | 4/1994 | |
| JP | 1995-140648 | 6/1995 | |
| JP | 1997-087362 A | 3/1997 | |
| JP | 1997-132623 A | 5/1997 | |
| JP | 1997-309944 | 12/1997 | |

OTHER PUBLICATIONS

"should", Google Web definition sheet generated by examiner on Jun. 3, 2005, two pages.*
"epoxy"as defined by Biology-online.org, copied from world wide web on Jun. 3, 2005 by examiner, one page.*
"Biphenylenes" Durham Organics Limited, 2 pages printed from the web on Jun. 3, 2005, www.shigematsu-bio.com/j/supplier/durah/biphenylenes.html.*
FR-2. Ring Systems Used as Components, Fused Ring and Bridged Fused Ring Nomenclature, IUPAC Recommendations 1998, 7 pages printed from the web on Jun. 3, 2005 at www.chem.qmul.ac.uk/iupac/fusedring/FR21.htm.*
Kiuchi et al , Nec Res. & Development, vol. 44, No. 3, Jul. 2003, pp. 256-262.*
Iji et al, Polymers for Advanced Technologies, Poly. Acv. Technol. 12, 393-406 (2001).*
Weil et al, "A Review of Current Flame Retardant Systems for Epoxy REsin", Journal of Fires Sciences, vol. 22, Jan. 2004. pp. 25-40.*
Licari , JJ. , Coating Materials for Electronic Applications—Polymers, Processes, Reliability, Testing, Publisher: William Andrew Publishing/ Noyes, 2003 ISBN 0-8155-1492-1 released on Knovel database Jun. 3, 2003.*

* cited by examiner

*Primary Examiner*—Cynthia Hamilton
(74) *Attorney, Agent, or Firm*—Jonathan D. Baskin

(57) ABSTRACT

Negative type photosensitive resin compositions are provided. Such negative photosensitive resin compositions contain a novolac resin and a phenol-biphenylene resin as well as an epoxy compound. These resin compositions have excellent heat-impact resistance for the hardened resin material.

10 Claims, No Drawings

NEGATIVE TYPE PHOTOSENSITIVE RESIN COMPOSITION CONTAINING A PHENOL-BIPHENYLENE RESIN

BACKGROUND OF THE INVENTION

This invention is related to a negative type photosensitive resin composition containing a phenol/biphenylene resin and a method for forming of a resist pattern using the negative type photosensitive resin composition.

Due to its high reliability, epoxy resin composition containing epoxy resin and phenol resin has been widely used as a sealing material for semiconductor devices, such as IC and LSI. Recently, a photosensitive resin composition containing both epoxy resin and phenol resin has been proposed to replace the conventional phenol resin for the formation of resist in the manufacturing process of WL-CSP (wafer level chip size packaging) to achieve good physical properties. The photosensitive resin composition usually contains cresol/xylenol novolac resin, epoxy resin, melamine resin, as well as a photosensitive component.

In terms of forming a pattern through exposure and development, the photosensitive resin composition is able to provide sufficient photolithographic performance. However, the physical properties of the resin pattern formed by the photosensitive resin composition are not sufficient and the resin pattern is unable to withstand the reliability test and heat-impact resistance test required for a permanent resist.

Generally, an epoxy resin with a high molecular weight (the higher the epoxide equivalent, the longer the distance between the structural core) can be used alone or added to a resin composition to increase the heat-impact resistance of an insulating resist based on a hardened resin material. For the purpose of photolithography, however, it is very difficult to use an epoxy resin with a high molecular weight due to the difficulties in the development process using an aqueous alkaline solution. Therefore, it is highly desirable to develop a photosensitive resin composition, which has excellent photolithographic performance as well as sufficient heat-impact resistance of the hardened resin pattern.

SUMMARY OF THE INVENTION

The inventors carried out a series of studies on various additives for a negative type photosensitive resin composition including an epoxy compound and a novolac resin. As a result, it was found that by adding a phenol-biphenylene resin to the resin composition, the heat-impact resistance of the hardened resin pattern can be significantly improved while the photolithographic performance can be maintained. This invention has been completed based on the above discovery.

The purpose of this invention is to solve the problems mentioned above and provide a negative type photosensitive resin composition, which includes an epoxy compound, a novolac resin, and a phenol-biphenylene resin and has good photolithographic performance as well as improved heat-impact resistance of the hardened resin pattern.

DETAILED DESCRIPTION

This invention concerns a negative type photosensitive resin composition, which includes an epoxy compound, a novolac resin, and a phenol/biphenylene resin.

Moreover, this invention also concerns a method for the formation of a resist pattern, characterized by coating the negative type photosensitive resin composition described above on a substrate, followed by exposure and development of the negative type photosensitive resin composition layer coated on the substrate to form the resist pattern.

The negative type photosensitive resin composition of this invention contains an epoxy compound. The epoxy compound is an organic compound having one or more oxirane rings capable of ring-opening polymerization. The compound is generally referred to as an epoxide, including aliphatic, alicyclic, aromatic, and heterocyclic epoxide present as a monomer, oligomer, or polymer. In general, the compound is an epoxide carrying average 2 or more polymerizable epoxy groups per molecule. A polymeric epoxide can be, for example, a linear polymer carrying terminal epoxy groups, such as polyoxyalkylene glycol diglycidyl ether, a polymer containing an oxirane unit in the main polymer chain, such as polybutadiene polyepoxide, or a polymer containing an epoxy group in the side chain of the polymer, such as polymer or oligomer of diglycidyl methacrylate. The epoxide can be either a pure compound or a mixture of compounds, each containing one or two or more epoxy groups per molecule.

The epoxy compound can be, for example, a low molecular weight monomer, an oligomer, or a high molecular weight polymer, which may have various main chains and carry various substituent groups. For example, the main chain can be any type of polymer chain, while the substituent group can be a group capable of being joined to an oxirane unit. Examples of the substituent group include, but are not limited to, halogen atoms, ester groups, ether groups, sulfonate groups, siloxane groups, nitro groups, and phosphate groups.

Preferably, the epoxy compound of this invention is a glycidyl ether, such as a polyvalent phenol glycidyl ether. Glycidyl ethers may be prepared through the reaction of a polyvalent phenol with excess chlorohydrin or epichlorohydrin, such as diglycidyl ether of 2,2-bis(2,3-epoxy-propoxyphenol)-propane. More preferably, the epoxy compound of this invention is a bisphenol A type epoxy compound. Bisphenol A epoxy compounds may be prepared through the reaction of bisphenol A with epichlorohydrin. In one embodiment, the epoxy compound of this invention is the compound represented by the following general formula (I):

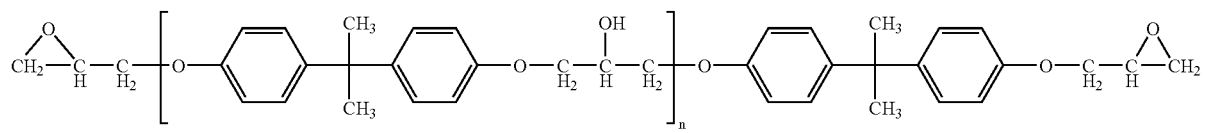

(I)

wherein, n=0–2, preferably n=0–1, and more preferably n=0.

Specific examples of the epoxy compound are described in U.S. Pat. No. 3,018,262. In general, epoxy compounds used in this invention are commercially available. For example, commercially available epoxies include, without limitation: epichlorohydrin, glycidol, glycidyl methacrylate, p-tert-butylphenol glycidyl ether such as EPI-REZ 5014 (Celanese Co.), bisphenol A diglycidyl ethers such as EPON 828, EPON 1004, EPON 1010 (Shell Chemical Co.), DER-331, DER-332, and DER-334 (Dow Chemical Co.), vinylcyclohexene dioxide such as ERL-4206 (Union Carbide Corp.), 3,4-epoxy-6-methyl-cyclohexylmethyl 3,4-epoxy-6-methyl-cyclohexenecarboxylate such as ERL-4201 (Union Carbide Corp.), bis(3,4-epoxy-6-mehtyl-cyclohexylmethyl)adipate such as ERL-4289 (Union Carbide Corp.), bis(2,3-epoxy-cyclopentyl)ether such as ERL-0400 (Union Carbide Corp.), polypropylene-glycol-modified aliphatic epoxide such as ERL-4050 and ERL-4269 (Union Carbide Corp.), dipentene dioxide such as ERL-4269 (Union Carbide Corp.), flame-retardant brominated bisphenol type epoxy resin such as DER-580 (Dow Chemical Co.), 1,4-butanediol diglycidyl ether/phenol formaldehyde novolac such as DEN-431 and DEN-438 (Dow Chemical Co.), and resorcinol diglycidyl ether such as Kopoxite (Koppers Company, Inc.).

The negative type photosensitive resin composition of this invention contains a phenol-biphenylene resin. The phenol-biphenylene resin is a polymer including phenol and biphenylene repeating units. The phenol and biphenylene can be connected in any sequence. In addition to the phenol and biphenylene repeating unit, the polymer may also include an alkylene repeating unit, such as methylene and ethylene. Moreover, the phenol and biphenylene repeating unit may also be substituted, such as with alkyl and/or alkoxy as long as the substituent will not affect the results of this invention. The phenol-biphenylene resin has no epoxy group. The phenol-biphenylene resin can be prepared by any conventional method. Commercially available products, such as Phenol Resin MEH-7851 (Meiwa Kasei Co.), may suitably be used.

In one embodiment, the phenol-biphenylene resin is a polymer including the repeating unit represented by following general formula (II):

phenol and aldehyde. In this invention, the novolac resin should not contain the phenol-biphenylene resin described above and should not have an epoxy group. The weight-average molecular weight of the novolac resin typically in the range of 2000–60000, and preferably 5000–40000.

The content of the novolac resin n the present negative type photosensitive resin composition is typically in the range of 10 weight % or higher, preferably 15 weight % or higher, and more preferably 20 weight % or higher, calculated based on the total weight of the novolac resin and phenol-biphenylene resin and other resin binder, if necessary.

The novolac resin can be prepared through polycondensation reaction of at least one aromatic hydrocarbon, such as, but not limited to, m-cresol, o-cresol, p-cresol, 2,5-xylenol, 3,5-xylenol, resorcinol, pyrogallol, bisphenol, bisphenol A, trisphenol, o-ethylphenol, m-ethylphenol, p-ethylphenol, propylphenol, n-butylphenol, t-butylphenol, 1-naphthol, and 2-naphthol, with at least one aldehyde or ketone, such as, but not limited to, formaldehyde, acetaldehyde, propionaldehyde, benzaldehyde, furfural, acetone, methyl ethyl ketone, and methyl isobutyl ketone, in the presence of an acid catalyst. Paraformaldehyde and paracetaldehyde can be used to replace formaldehyde and acetaldehyde, respectively.

Preferably, the novolac resin is prepared through polycondensation reaction of at least one phenol chosen from o-cresol, m-cresol, p-cresol, 2,5-xylenol, 3,5-xylenol, and resorcinol with at least one aldehyde chosen from formaldehyde, acetaldehyde, and propionaldehyde, in the presence of an acid catalyst.

In addition to the novolac resin and phenol-biphenylene resin described above, the present negative type photosensitive resin composition may also contain one or more other resin binders, which do not carry an epoxy group. The other resin binder can be, for example, poly(vinylphenol) as well as a homopolymer or copolymer of N-hydroxyphenylmaleimide.

The content of the other resin binder, if present, is typically in the range of 75 weight % or lower, and preferably 50 weight % or lower, with respect to the total weight of the novolac resin, the phenol-biphenylene resin, and the other resin binder. More preferably, the negative type pho-

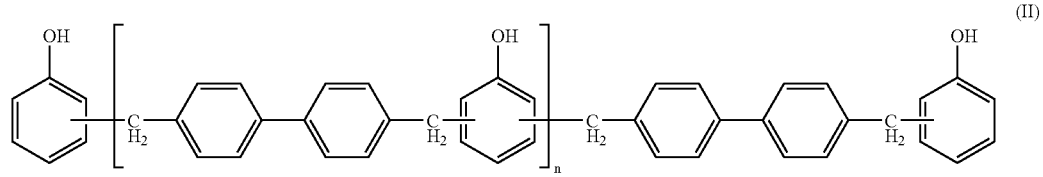

(II)

wherein the formula, n=0–4, preferably n=0–3, and more preferably n=0–1.

Typically, the number-average molecular weight of the phenol-biphenylene resin should be in the range of 350–1200, and preferably from 370–1000. The content of the phenol-biphenylene resin is typically in the range of 1–75 weight %, preferably 5–45 weight %, and more preferably 10–40 weight %, calculated based on the total weight of the novolac resin and phenol-biphenylene resin.

The negative type photosensitive resin composition of this invention also contains a novolac resin. The novolac resin is a thermoplastic condensation product formed from tosensitive resin composition of this invention does not contain such other resin binder.

In the present compositions, the ratio of the weight of the epoxy compound to the total weight of the novolac resin, the phenol-biphenylene resin, and the other resin binder if present [weight of epoxy compound/(weight of novolac resin+weight of phenol-biphenylene resin+weight of other resin binder if present)] is typically in the range of 0.5:1–2:1, and preferably 0.7:1–1.6:1.

The present compositions also contain a photo-acid-generating agent capable of generating an acid under irradiation of an active radiation beam. Any commonly used photoacid-generating agent is suitable for this purpose. Preferably, the photo-acid-generating agent is an onium salt. More preferably, the photo-acid-generating agent is an onium salt carrying a weak nucleophilic cation. The cation can be a metallic element or a nonmetallic element with 2–7 valences, such as, but not limited to, Sb, Sn, Fe, Bi, Al, Ga, In, Ti, Zr, Sc, D, Cr, Hf, and Cu as well as a halogen complex cation of B, P, and As. Exemplary onium salts are diaryl diazonium salts, onium salts of Group Va, Group Vb, Group Ia, Group Ib, and Group I elements, such as halonium salts, including aromatic iodonium salts and iodoxonium salts, quaternary ammonium, phosphonium and arsonium salts, aromatic sulfonium salts, sulfoxonium salts, and selenonium salts. The photo-acid-generating agent can be prepared by any conventional method. Commercially available products, such as triallylsulfonium hexafluorophosphate, may be suitably used.

When the photo-acid-generating agent is an iodonium salt, it is preferable to use a salt formed from aryliodoso tosylate and aryl ketone, such as by the method described in U.S. Pat. No. 4,683,317.

In one embodiment, the photo-acid-generating agent may also be a nonionic organic compound. Preferably, the nonionic organic compound is a halogenated nonionic organic compound, such as, but not limited to, 1,1-bis(p-chlorophenyl)-2,2,2-trichloroethane (DDT); 1,1-bis(p-methoxyphenyl)-2,2,2-trichloroethane) (Methoxychlor); 1,2,5,6,9,10-hexabromocylododecane; 1,10-dibromodecane; 1,1-bis(p-chlorophenyl)-2,2-dichloroethane; 4,4'-dichloro-2-(trichloromethyl)benzhydrol, 1,1-bis(chlorophenyl)-2,2,2-trichloroethanol (Kelthane); hexachlorodimethylsulfone; 2-chloro-6-(trichloromethyl)pyridine; O,O-diethyl-O-(3,5,6-trichloro-2-pyridyl)phosphorothioate (Dursban); 1,2,3,4,5,6-hexachlorocyclohexane; N-1,1-bis(p-chlorophenyl)-2,2,2-trichloroethylacetamide, tris(2,3-dibromopropyl) isocyanurate; 2,2-bis(p-chlorophenyl)-1,1-dichloroethylene, as well as the isomers, analogs, and derivatives of these compounds. Among these compounds, however, it is preferable to use tris(2,3-dibromopropyl)isocyanurate. Exemplary photo-acid-generating agents suitable for the purpose of this invention are described in European patent No. 0232972.

The photo-acid-generating agent should be present in the compositions in an amount sufficient for the development of a coating layer of the composition after exposure to active radiation or after exposure and post-exposure baking treatment.

In addition to the components described above, the compositions may also contain a suitable amount of a crosslinking agent, if necessary. Any commonly used crosslinking agent is suitable for this purpose. Examples of the crosslinking agent include, but are not limited to, amine-based compounds such as monomer, oligomer, and polymer of melamine, various resin materials such as melamine-formaldehyde resin, benzoguanamine-formaldehyde resin, urea-formaldehyde resin, and glycoluril-formaldehyde resin, as well as a combination of these crosslinking agents. Amine-based crosslinking agents, such as CYMEL 300, 301, 303, 350, 370, 380, 1116, and 1130; (American Cyanamid Company, Wayne, N.J.), CYMEL 1123 and 1125 (benzoguanamine resin), CYMEL 1170, 1171, and 1172; (glycoluril resin), and BEETLE 60, 65, and 80 (urea resin) are preferred. Other similar amine-based compounds are also commercially available from different vendors.

Among the amine-based crosslinking agents described above melamine resins, and melamine-formaldehyde resins are preferred with melamine-formaldehyde resins being more preferred. Melamine-formaldehyde resins are typically reaction products of melamine and formaldehyde. The resin material is usually an ether, such as trialkylolmelamine or hexaalkylolmelamine. The alkyl group may contain 1–8 or more carbon atoms. However, methyl group is preferable. Depending on the reaction conditions and the concentration of formaldehyde used, the methyl ether moieties may react with each other to form complicated units.

The negative type photosensitive resin compositions may also include a photosensitizer. The photosensitizer is added at a sufficient quantity to increase the sensitivity at a desirable range of wavelength. Photosensitizer examples include, without limitation, 2-ethyl-9,10-dimethoxyanthracene, 9,10-dichloroanthracene, 9,10-phenylanthracene, 1-chloroanthracene, 2-methylanthracene, 9-methylanthracene, 2-t-butylanthracene, anthracene, 1,2-benzoanthracene, 1,2,3,4-dibenzoanthracene, 1,2,5,6-dibenzoanthracene, 1,2,7,8-dibenzoanthracene, and 9,10-dimethoxydimethylanthracene. Preferred photosensitizers are 2-ethyl-9,10-dimethoxyanthracene, N-methylphenothiazine, and isopropylthioxanthone.

The present compositions may also include one or more other additives, including, without limitation, dyes, fillers, wetting agents, flame retardants, leveling agents, and silane coupling agents. When the present composition is used on a silicon substrate, it is preferable to use a silane coupling agent to improve the affinity of the resin film to the silicon substrate.

The concentration of the other additives in the composition invention should be determined depending on the nature of the additive, the application of the resin composition, and the type of the substrate among other factors. There is no special limitation on the concentration of the additive.

Moreover, the compositions of this invention may also contain a suitable solvent capable of dissolving the components described above. There is no special limitation on the solvent used for this purpose, as long as the solvent is able to dissolve the components present in the composition. Suitable solvents include, but are not limited to, one or more of: glycol ethers such as ethylene glycol monomethyl ether, propylene glycol monomethyl ether, and dipropylene glycol monomethyl ether, esters such as methyl cellosolve acetate, ethyl cellosolve acetate, 1-methoxy-2-propyl acetate, propylene glycol monomethyl ether acetate, dipropylene glycol monomethyl ether acetate, dibasic esters, propylene carbonate, γ-butyrolactone, and alcohols such as n-propanol.

The present compositions can be prepared by dissolving the components described above in a solvent. The concentration of the solid component present in the composition should be determined based on various factors, such as the method for applying the composition on a substrate, and the nature of the components. Usually, the concentration of the solid component should be in the range of 10–70 weight % or higher with respect to the total weight of the negative type photosensitive resin composition. When the resin composition is used for flow coating, the concentration of the solid component is typically in the range of about 40–50 weight % or higher with respect to the total weight of the composition.

Another embodiment of this invention is a method for the formation of a resist pattern on a substrate using the following procedure. A layer of the present negative type photosensitive resin composition is first coated on a substrate, and then the negative type photosensitive resin com position layer is exposed and developed to form a resist pattern.

The negative type photosensitive resin composition of this invention can be coated on a substrate using any conventional method, such as screen printing, flow coating, roller coating, slot coating, spin coating, electrostatic spraying, spray coating, and dip coating. Lamination of a dry film onto a substrate may also used. There is no special limitation on the coating method. As described above, the viscosity of the composition should be adjusted according to the coating method employed. If a low viscosity is needed, a solvent should be added to the resin composition. On the other hand, if a high viscosity is needed, a thickening agent or filler should be added to the resin composition. There is no special limitation on the thickness of the layer formed by the present composition on the substrate. The thickness of the resin composition layer should be determined based on the requirements of the resist pattern.

Any substrate may be used in the present method, as along as the substrate is suitable for the formation of a resist pattern. The substrate may have any shape and can be made of any material. Examples of the material for the substrate are resin, ceramic, and metal. The resin substrate can be, for example, printed circuit board, and semiconductor package. The ceramic substrate can be, for example, a semiconductor package. The metal substrate can be, for example, a copper film. The glass substrate can be, for example, a display device, such as LCD, and FPD. The substrate can also be made from a combination of insulating material and conducting material, for example, a conducting metal pattern formed on a resin plate, or a combination of different conducting materials, for example, a sputtered copper film coated on a silicon wafer.

After having been coated on the substrate, the negative type photosensitive resin composition is dried to remove the solvent. If necessary, a soft baking treatment is carried out by heating the composition layer to evaporate the solvent selectively. The conditions for the soft baking treatment, such as treatment temperature and treatment time, should be determined based on the properties of the solvent and the resin composition.

In the exposure step, the negative type photosensitive resin composition layer coated on the substrate is irradiated with an active radiation beam. There is no special limitation on the radiation source used in the exposure step. However, a light beam at 436 nm, 405 nm, 365 nm, and 254 nm from a mercury lamp and a light beam at 157 nm, 193 nm, 222 nm, and 248 nm are preferable. The light source can be either monochromatic or have a broad spectrum. The exposure step may also be carried out using a phase-shift method. When the present composition layer is irradiated through a photomask pattern, the pattern is transferred onto the resin composition.

After the exposure step, post-exposure baking (PEB) treatment is carried out with any conventional method under suitable conditions. For example, (PEB) can be carried out using a hot plate at a temperature of 70–140° C. for 15 seconds to 10 minutes. Instead of a hot plate, a convection oven may also be used. In this case, a longer time period may be needed compared to the treatment using a hot plate.

In the development step, the resin composition layer is contacted with a developing agent. Any conventional developing agent can be used at a suitable concentration. The developing agent is usually an aqueous solution of an inorganic salt, such as potassium hydroxide, sodium metasilicate, ammonia, a primary amine such as ethylamine, and n-propylamine, a secondary amine such as diethylamine, and di-n-propylamine, a tertiary amine such as triethylamine, and trimethylamine, a quaternary ammonium salt such as tetramethylammonium hydroxide (TMAH), and trimethylhydroxyethylammonium hydroxide.

Organic solvents may also be used as a developing agent. Suitable organic solvents include, without limitation, esters, esters, ketones, amines, and alcohols. Exemplary organic solvents include γ-butyrolactone, ethylene glycol monomethyl ether, ethylene glycol monoethyl ether, diethylene glycol monobutyl ether, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, ethylene glycol monomethyl ether acetate, ethylene glycol monoethyl ether acetate, propylene glycol monomethyl ether acetate, propylene glycol monoethyl ether acetate, propylene glycol monopropyl ether acetate, propylene glycol monobutyl ether acetate, ethyl acetate, n-propyl acetate, iso-propyl acetate, methyl lactate, ethyl lactate, n-propyl lactate, 2-heptanone, 3-heptanone, 4-heptanone, cyclohexanone, N-methylpyrrolidone, and iso-propyl alcohol. In the developing step, the resin component must be soluble in the developing agent and will not deposit again on the substrate surface when the developing agent evaporates. Therefore, as the developing agent, it is preferable to use a high-boiling-point solvent, such as N-methyl-pyrrolidone, γ-butyrolactone, propylene carbonate, and diethylene glycol monobutyl ether, or an aqueous solution mentioned above. When using an organic solvent as the developing agent, the organic solvents listed above can be used alone or as a mixture containing two or more of them. In addition, a mixture of the organic solvent with the aqueous solution can be used. Moreover, the developing agent may contain both organic base and inorganic base.

If necessary, the developing agent may also contain an alcohol or a surfactant. Before the developing step, the developing agent can be filtered through a microfilter to remove small particles, such as dust.

The negative type photosensitive resin composition of this invention can be used in the general manufacturing process of integrated circuits (ICs) and is very useful for manufacturing WL-CSP and ultra LSI. The resin composition of this invention can also be used in the preparation of masks and printing plates including lithographic plates, relief plates, and intaglio plates, as photoresist and solder resist for printed circuit boards, color filter for liquid crystal display, in the formation and duplication of relief images, as well as in the manufacturing of photo-hardening ink, paint, and adhesive. However, the negative type photosensitive resin composition of this invention is particularly useful for manufacturing WL-CSP and other semiconductor circuits.

In the following, this invention is explained in more detail with practical examples. However, these practical examples should not be considered as limitations of this invention.

PRACTICAL EXAMPLES

Evaluation of Developing Properties

In the following practical examples and comparative examples, the resist pattern was formed through Steps 1–5 and then evaluated.

Step 1: The negative type photosensitive resin composition of this invention prepared in practical examples and comparative examples was coated on a silicon wafer using a spin coater to form a coating layers with a thickness of 11 µm after drying.

Step 2: The negative type photosensitive resin composition film coated on the substrate was heated in a convection oven at 90° C. for 30 minutes.

Step 3: The substrate was covered with a quartz mask printed with a chromium wire pattern and then irradiated with UV light generated by a high-pressure mercury lamp (lines i, g, and h) at a total exposure of 750 mJ at line i.

Step 4: The exposed substrate was heated in a convection oven at 80° C. for 20 minutes for the post-exposure baking treatment.

Step 5: In the developing treatment using an inorganic base, the substrate was dipped into an aqueous developing solution containing 0.42 mol/L of KOH at 35° C. for 3 minutes. The formation of the resist pattern was confirmed by visual inspection. In the developing treatment using an organic solvent, the substrate was dipped in N-methylpyrrolidone at 23° C. for 1.5 minutes. The formation of the resist pattern was confirmed by visual inspection.

Practical Examples 1–3 and Comparative Examples 1–2

In Practical Examples 1–3 and Comparative Examples 1–2, resist patterns were formed with the negative type photosensitive resin compositions listed in Table 1 through Steps 1–5 shown above. The evaluation results are shown in Table 1.

The following symbols are used in Table 1 under the items of "inorganic base developing performance" and "organic solvent developing performance".

"O"=composition layer was completely developed.
"X"=Not developed at all.

In the table, the following components were used.

Novolac resin (weight-average molecular weight 30000): (Cresol/xylenol/formaldehyde resin MER-A-S, Meiwa Kasei Co., Ltd.)

Phenol-biphenylene resin (softening point: 79° C.; OH eq: 207 g/eq) (Phenol Resin MEH-7851M, Meiwa Kasei Co.)

Epoxy resin: Bisphenol A type epoxy resin (Epikote 828, Japan Epoxy Resin Co., Ltd.)

Crosslinking agent: Hexamethoxymethylated melamine (Mitsui Saitech Co., Ltd.)

Photo-acid-generating agent: Triallylsulfonium hexafluorophosphate

Photosensitizer: 2-Ethyl-9,10-dimethoxyanthracene

Silane coupling agent: γ-glycidoxypropyltrimethylsilane (Torei-Dow—Corning Silicone Co., Ltd.)

PMA: 1-Methoxy-2-propyl acetate

TABLE 1

| | Comparative Example 1 | Practical Example 1 | Practical Example 2 | Practical Example 3 | Comparative Example 2 |
|---|---|---|---|---|---|
| Component | | | | | |
| Novolac resin (g) | 23 | 17 | 11 | 6 | — |
| Phenol-biphenylene resin (g) | — | 6 | 11 | 17 | 23 |
| Epoxy resin (g) | 32 | 29 | 25 | 22 | 19 |
| Crosslinking agent (g) | 3 | 2 | 2 | 2 | 1 |
| Photo-acid-generating agent (g) | 4 | 3 | 3 | 3 | 3 |
| Photosensitizer (g) | 0.4 | 0.4 | 0.4 | 0.4 | 0.4 |
| Silane coupling agent (g) | 1 | 1 | 1 | 1 | 1 |
| PMA (g) | 38 | 38 | 38 | 38 | 38 |
| Inorganic base developing performance | o | o | x | x | x |
| Organic solvent developing performance | o | o | o | o | o |

In Practical Example 1, the negative type photosensitive resin composition contained both phenol-biphenylene resin and novolac resin. Development was observed under the conditions using a base. In Practical Examples 2 and 3, the content of the phenol-biphenylene resin in the negative type photosensitive resin composition was increased, no development was observed under the conditions of using a base. However, development was possible under the conditions of using an organic solvent, N-methylpyrrolidone.

In Comparative Example 2, the negative type photosensitive resin composition contained phenol-biphenylene resin but not novolac resin. No development was observed under the conditions using a base. However, in Comparative Example 1, the negative type photosensitive resin composition contained novolac resin but not phenol-biphenylene resin. Development was observed under the conditions using a base.

Thermal Cycle Test for the Hardened Resin Composition

Using the procedure listed in following Steps 1–13, the resin compositions prepared in Practical Example 1 and Comparative Example 1 were coated in two layers on a wafer to form a 2-mm square window pattern. The thermal cycle test was carried out in the gas phase (−65° C./15 minutes~150° C./15 minutes).

Step 1: The negative type photosensitive resin composition prepared in Practical Example 1 or Comparative Example 1 was coated onto a silicon wafer using a spin coater to form a coating film (layer 1) with a thickness of 11 µm after drying.

Step 2: The negative type photosensitive resin composition film coated on the substrate was heated in a convection oven at 90° C. for 30 minutes.

Step 3: The substrate was irradiated with UV light generated by a high-pressure mercury lamp (lines i, g, and h) at a total exposure of 750 mJ at line i in the absence of a pattern mask.

Step 4: The exposed substrate is heated in a convection oven at 80° C. for 20 minutes for the post-exposure baking treatment.

Step 5: The substrate was heated in a convection oven at 130° C. for 30 minutes for the pre-hardening treatment.

Step 6: The substrate was further heated in a convection oven at 175° C. for 3 hours for the thermal hardening treatment.

Step 7: On layer 1, the negative type photosensitive resin composition prepared in Practical Example 1 or Comparative Example 1 was coated using a spin coater to form a coating film (layer 2) with a thickness of 30 μm after drying.

Step 8: The substrate coated with the negative type photosensitive resin composition was heated in a convection oven at 90° C. for 30 minutes.

Step 9: The substrate was covered with a quartz mask printed with a chromium wire pattern and then irradiated with UV light generated by a high-pressure mercury lamp (lines i, g, and h) at a total exposure of 3000 mJ at line i to form a 2-mm square window pattern.

Step 10: The exposed substrate is heated in a convection oven at 80° C. for 20 minutes for the post-exposure baking treatment.

Step 11: In the developing treatment using an inorganic base, the substrate was dipped in an aqueous developing solution containing 0.42 mol/L of KOH at 35° C. for 3 minutes and then washed with distilled water.

Step 12: The substrate was heated in a convection oven at 130° C. for 30 minutes for the pre-hardening treatment.

Step 13: The substrate was further heated in a convection oven at 175° C. for 3 hours for the thermal hardening treatment.

In Practical Example 1 and Comparative Example 1, the samples were tested in a gas-phase thermal cycle test (−65° C./15 minutes~150° C./15 minutes per cycle). In Comparative Example 1, cracking occurred at 750 cycles. However, in Practical Example 1, no cracking occurred up to 1400 cycles. The result suggests that, as compared to the conventional negative type photosensitive resin composition, the negative type photosensitive resin composition of this invention has excellent heat-impact resistance for the hardened resin material.

SIGNIFICANCE OF THE INVENTION

As described above, the negative photosensitive resin composition of this invention contains a novolac resin and a phenol-biphenylene resin as the base resin as well as an epoxy compound. The negative photosensitive resin composition of this invention has excellent heat-impact resistance for the hardened resin material compared to the current negative type photosensitive resin composition, while maintaining the lithographic performance.

What is claimed is:

1. A negative photosensitive resin composition, comprising an epoxy compound, a novolac resin, a phenol-biphenylene resin, and a photo-acid-generating agent.

2. The negative photosensitive resin composition of claim 1, wherein the phenol-biphenylene resin is present in the range of 5–45 weight % with respect to the total weight of the novolac resin and phenol-biphenylene resin.

3. A method for the formation of a resist pattern, comprising coating a layer of the negative photosensitive resin composition of claim 1 on a substrate, followed by exposing and developing the negative type photosensitive resin composition layer coated on the substrate to form a resist pattern.

4. The negative photosensitive resin composition of claim 1, wherein the epoxy compound is a glycidyl ether.

5. The negative photosensitive resin composition of claim 1, wherein the epoxy compound is a bisphenol A epoxy compound.

6. The negative photosensitive resin composition of claim 1, wherein the epoxy compound is a compound represented by general formula:

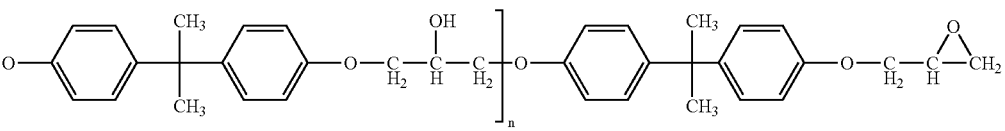

wherein n is 0–2.

7. The negative photosensitive resin composition of claim 1, wherein the phenol-biphenylene resin is a polymer comprising a repeating unit represented general formula:

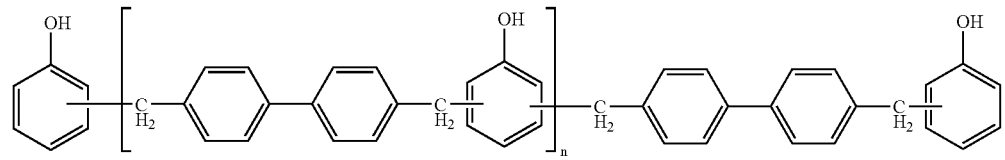

wherein n=0–4.

8. A negative photosensitive resin composition, comprising a bisphenol A epoxy compound, a novolac resin, and a phenol-biphenylene resin, wherein the composition is photosensitive and wherein the phenol-biphenylene resin is present in the range of 5–45 weight % with respect to the total weight of the novolac resin and phenol-biphenylene resin.

9. The negative photosensitive resin composition of claim 8, wherein the epoxy compound is a compound represented by general formula:

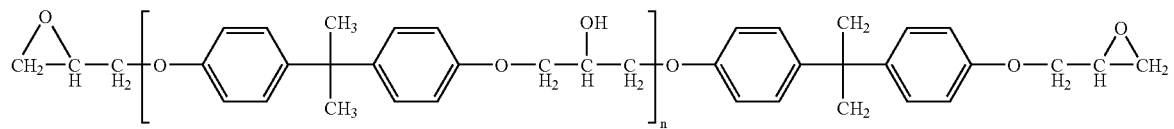
wherein n is 0–2.
10. The negative photosensitive resin composition of claim 8, wherein the phenol-biphenylene resin is a polymer comprising a repeating unit represented general formula:
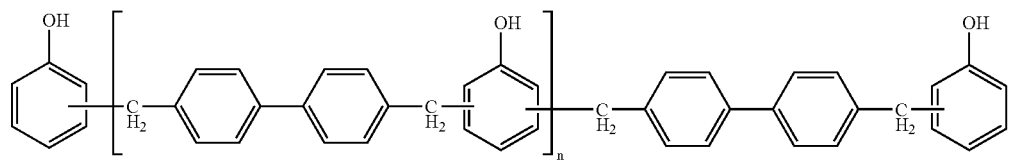
wherein n=0–4.
* * * * *